United States Patent
Wang et al.

(10) Patent No.: US 6,614,170 B2
(45) Date of Patent: Sep. 2, 2003

(54) LIGHT EMITTING DIODE WITH LIGHT CONVERSION USING SCATTERING OPTICAL MEDIA

(75) Inventors: Wang-Nang Wang, Bath (GB); Wen-Chieh Huang, Taipei (TW)

(73) Assignee: Arima Optoelectronics Corporation, Taoyuan Hsien (TW)

( * ) Notice: Subject to any disclaimer, the term of this patent is extended or adjusted under 35 U.S.C. 154(b) by 166 days.

(21) Appl. No.: 09/794,899

(22) Filed: Feb. 26, 2001

(65) Prior Publication Data

US 2002/0085601 A1 Jul. 4, 2002

Related U.S. Application Data

(63) Continuation-in-part of application No. 09/751,405, filed on Dec. 29, 2000.

(51) Int. Cl.[7] .............................................. H01J 63/04
(52) U.S. Cl. ....................................................... 313/498
(58) Field of Search ................................ 313/498, 499, 313/501, 502, 503, 509, 512, 506

(56) References Cited

U.S. PATENT DOCUMENTS 5,583,394 A * 12/1996 Burbank et al. ............ 313/498
5,700,591 A * 12/1997 Okajima et al. ............ 428/690

(List continued on next page.)

*Primary Examiner*—Sandra O'Shea
*Assistant Examiner*—Sumati Krishnan
(74) *Attorney, Agent, or Firm*—Darby & Darby

(57) ABSTRACT

The invention provides a light emitting diode (LED) or other light emitting means such as a laser diode (LD) comprising a light emitting component and scattering optical media such as dielectric phosphor powder (DPP) which absorb a part of light emitted by the light emitting component and emits light of a wavelength that is different from that of the absorbed light. In a preferred embodiment according to the invention, the LED includes a crystalline semiconductor chip serving as the light emitting component. The scattering optical media such as dielectric phosphor powder (DPP) is made of a mixture of phosphor particles and microscopic, nearly spherical dielectric particles with a band gap larger than 3 eV (which do not absorb blue light in the spectrum). The scattering optical media such as DPP can also include phosphor particles, and bubbles (or voids) instead of the dielectric particles. The bubbles of the DPP have a band gap larger than 3 eV which do not absorb blue light in the spectrum. The bubbles can be air bubbles, N2 bubbles, noble gas bubbles. Furthermore, the scattering optical media such as DPP can also be a mixture of the bubbles, dielectric particles, and the phosphor particles. According to another embodiment, the invention provides a light emitting diode (LED) comprising a light emitting component (such as a crystalline semiconductor chip) and scattering optical media such as dielectric phosphor powder (DPP) made of a mixture of crystalline phosphor particles and microscopic, nearly spherical dielectric particles. According to yet another embodiment, the invention provides a light emitting diode (LED) comprising a light emitting component (such as an AlInGaN crystalline semiconductor chip) encapsulated into scattering optical media such as dielectric phosphor powder (DPP). The DPP is made of a mixture of microscopic, nearly spherical dielectric particles of microcrystalline AlN. The LED according to this particular embodiment can also be a white LED. An exemplary structure of an LED according to a preferred embodiment of the invention comprises a crystalline semiconductor chip encapsulated into epoxy, wires connected to the semiconductor chip, metallic leads connected to the wires, and an epoxy encapsulation covered with scattering optical media such as dielectric phosphor powder (DPP). The DPP is made of a mixture of nearly spherical dielectric particles with crystalline phosphor particles embedded into the epoxy.

34 Claims, 3 Drawing Sheets

U.S. PATENT DOCUMENTS

| | | | |
|---|---|---|---|
| 5,813,752 A | * 9/1998 | Singer et al. | 362/293 |
| 5,847,507 A | 12/1998 | Butterworth et al. | 313/512 |
| 5,925,897 A | * 7/1999 | Oberman | 257/80 |
| 5,959,316 A | 9/1999 | Lowery | 257/98 |
| 5,998,925 A | * 12/1999 | Shimizu et al. | 313/486 |
| 6,069,440 A | * 5/2000 | Shimizu et al. | 313/486 |
| 6,345,903 B1 | * 2/2002 | Koike et al. | 362/249 |
| 6,466,135 B1 | * 10/2002 | Srivastava et al. | 340/815.4 |

* cited by examiner

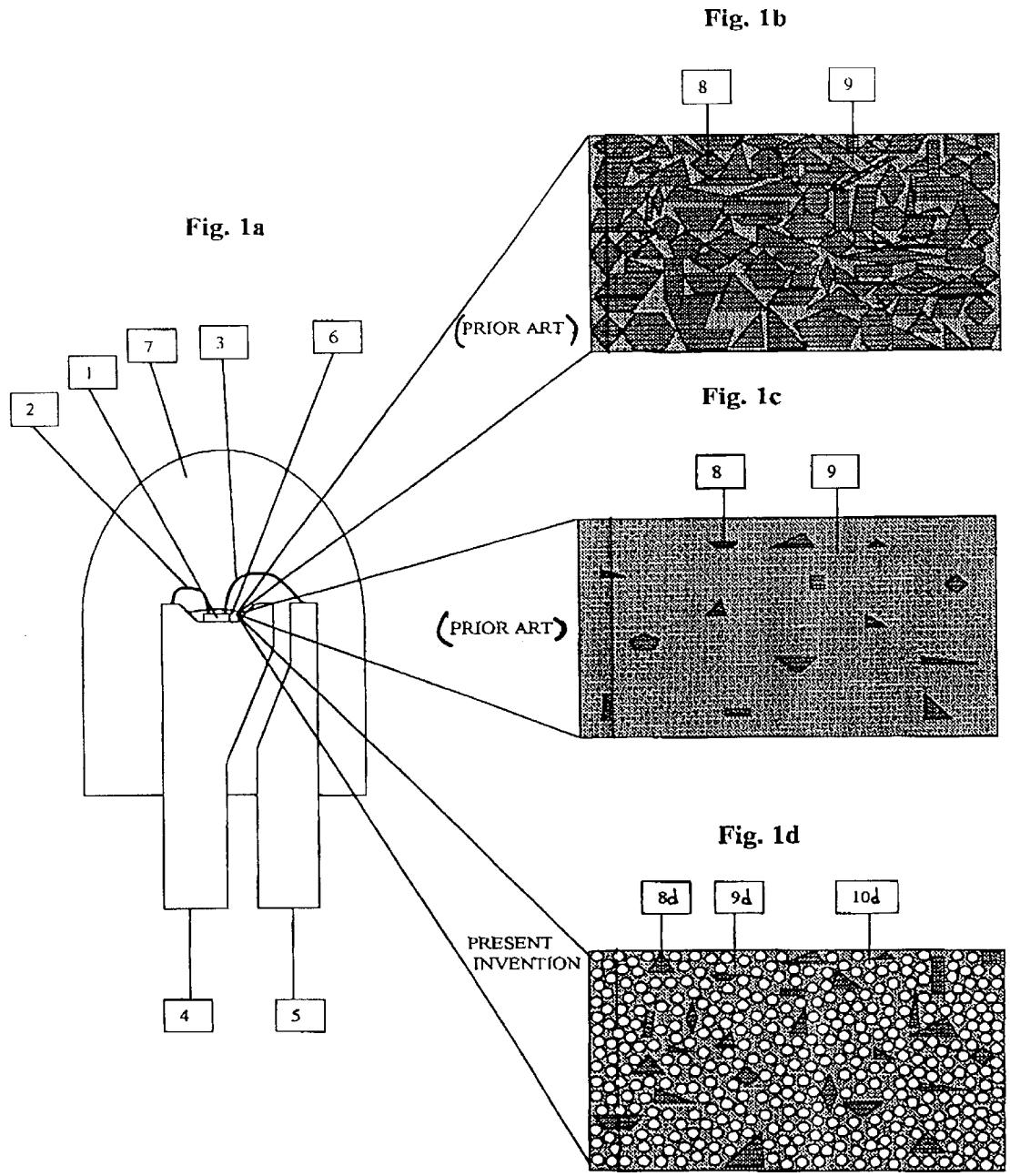

LIGHT EMITTING DIODE WITH LIGHT CONVERSION USING SCATTERING OPTICAL MEDIA

RELATED APPLICATIONS

The present application is a continuation-in-part (CIP) application of, and claims priority to copending U.S. patent application Ser. No. 09/751,405 filed on Dec. 29, 2000 entitled LIGHT EMITTING DIODE WITH LIGHT CONVERSION BY DIELECTRIC PHOSPHOR POWDER, which is incorporated herein by reference.

FIELD OF THE INVENTION

The invention generally relates to a light emitting diode (LED), and more particularly, to the fabricating of LEDs with light wavelength conversion using scattering optical media.

DESCRIPTION OF THE RELATED ART

A light emitting diode (LED) is a well known form of solid state illuminator. LEDs have been widely used as indicators, displays and light sources. As a semiconductor element, an LED is characterized by good burn-out rates, high vibration resistance, and durability in enduring repetitive ON and OFF operations.

Conventional LEDs generally emit light in the red portion of the light spectrum. For light wavelength conversion, e.g., shifting the wavelength of the light emitted from the red portion, the LED is doped using various impurities. Such a technique in the art of doping the LED with impurities cannot, however, provide feasibly efficient light emission across the entire range of the visible spectrum.

As opposed to red light, blue is at the short-wavelength end of the visible spectrum. Techniques have developed in the art to exploit the blue portion of the spectrum in generating a wider range of light emission from an LED. The relatively short wavelength of the blue light permits the shifting of the light emitted from a blue LED to the light emission of other colors in the spectrum, including a white light. This is accomplished through fluorescence or light wavelength conversion, which is a process where a light of relatively short wavelength is absorbed and re-emitted as a longer-wavelength light.

FIG. 1a is a diagram illustrating an LED with light wavelength conversion in the art. The LED includes a semiconductor chip 1, wires 2 and 3, leads 4 and 5, wavelength converting substance 6 and epoxy encapsulation 7. Semiconductor chip 1, serving as the light emitting component in the LED, generates primary light when an electrical current is applied to the chip 1 through wires 2 and 3, which are electrically connected to leads 4 and 5. The wavelength converting substance 6, containing a specified phosphor, covers the light emitting component (i.e., semiconductor chip 1) and is molded in resin. An n electrode and p electrode of the semiconductor chip 1 are connected to leads 4 and 5, respectively, by means of wires 2 and 3.

For light wavelength conversion, the active element of the LED is the wavelength converting substance 6 that partly absorbs the initial light from the semiconductor chip 1 and generates the secondary light. Part of the light generated from the semiconductor chip 1 (hereinafter referred to as the LED light) excites the phosphor contained in the wavelength converting substance 6 for generating a fluorescent light having a wavelength different from that of the LED light. The fluorescent light emitted by the phosphor and the LED light (which is output without contributing to the excitation of the phosphor) are mixed and output for emission. Consequently, the LED outputs a light having a wavelength different from that of the LED light emitted by the light emitting component, i.e., the semiconductor chip 1.

The phosphor included in the wavelength converting substance 6 can be fluorescent materials known in the art, or micro-crystals of garnet fluorescent material available in the art. For ultraviolet (UV) primary light emission, the wavelength converting substance 6 includes dense phosphor powder. FIG. 1b is a diagram illustrating, in conjunction with FIG. 1a, an LED with light wavelength conversion in the art using dense phosphor powder. The phosphor powder is embedded in epoxy 9 and densely deposited as a thin covering layer on the surface of the light emitting component (i.e., semiconductor chip 1). For blue primary light emission, the wavelength converting substance 6 includes dilute phosphor powder. FIG. 1c is a diagram illustrating, in conjunction with FIG. 1a, an LED with light wavelength conversion in the art using dilute phosphor powder. The phosphor powder is embedded in epoxy 9 and deposited, in a dilute proportion, on the surface of the light emitting component, as a thick cover, distant spherical or plan layer or as a lens molded to the semiconductor chip 1.

For light wavelength conversion, LEDs in the art (such as the LED disclosed in FIGS. 1a, 1b and 1c) have problems in controlling color uniformity in light emission. The primary light generated by semiconductor chip 1 is partially blocked by the electrode formed on the chip 1 which results in a particular emission pattern where light is not emitted uniformly in every direction or angle. The inclusion of the phosphor powder in the wavelength converting substance 6, however, causes the emission of the light in a uniform manner. The two conflicting phenomena in emission uniformity (or lack thereof) create substantial difficulties in controlling the light color uniformity over emission angles or directions that results in uncontrolled variation of the color of the light emission.

There is therefore a general need in the art for an improved LED with light wavelength conversion, and more particularly for an LED that overcomes the aforementioned problems in the art.

SUMMARY OF THE INVENTION

The invention provides a light emitting diode (LED) or other light emitting means such as a laser diode (LD) comprising a light emitting component and scattering optical media such as dielectric phosphor powder (DPP) which absorb a part of light emitted by the light emitting component and emits light of a wavelength that is different from that of the absorbed light. The employment of light scattering media or dispersion media such as dielectric particles (or any particles with a band gap larger than 3 eV, which do not absorb blue light in the spectrum) in an LED significantly improves the light uniformity of a light emitted by the LED.

In a preferred embodiment according to the invention, the LED includes a crystalline semiconductor chip serving as the light emitting component. The dielectric phosphor powder is made of a mixture of microscopic, nearly spherical dielectric particles and phosphor particles. The spherical dielectric micro-particles can be made of wide-band-gap semiconductors or transparent dielectrics. The DPP forms scattering optical media, whose refractive index, scattering properties and light conversion properties are controlled by the refractive index and radii of the dielectric particles. Using DPP in the LED allows effective light extraction from the light emitting component of the LED (e.g., the crystalline semiconductor chip), effective light wavelength conversion, and substantially uniform color distribution over emission angles, and wider emission angle of the light generated by the LED with DPP, in contrast to conventional LEDs with light conversion without DPP.

The scattering optical media such as DPP can also include phosphor particles, and bubbles (or voids) instead of the dielectric particles. The bubbles of the DPP have a band gap larger than 3 eV which do not absorb blue light in the spectrum. The bubbles can be air bubbles, N2 bubbles, noble gas bubbles. Furthermore, the DPP can also be a mixture of the bubbles, dielectric particles, and the phosphor particles.

According to another embodiment, the invention provides a light emitting diode (LED) comprising a light emitting component (such as a crystalline semiconductor chip) and scattering optical media such as dielectric phosphor powder (DPP) made of a mixture of crystalline phosphor particles and microscopic, nearly spherical dielectric particles.

According to yet another embodiment, the invention provides a light emitting diode (LED) comprising a light emitting component (such as an AlInGaN crystalline semiconductor chip) encapsulated into scattering optical media such as dielectric phosphor powder (DPP). The DPP is made of a mixture of microscopic, nearly spherical dielectric particles of microcrystalline AlN. The LED according to this particular embodiment can also be a white LED.

According to a further embodiment, the invention provides an LED comprising a light emitting component such as an InGaN semiconductor chip encapsulated into scattering optical media such as dielectric phosphor powder (DPP). The DPP is made of a mixture of nearly spherical dielectric particles of amorphous $Si_3N_4$ with radii generally between 50 and 5000 nm, and micro-crystals of garnet fluorescent material with radii generally between 1000 and 10,000 nm. The LED according to this particular embodiment can also be a white LED.

According to an additional embodiment, the invention provides an LED comprising a light emitting component such as an InGaN semiconductor chip encapsulated into scattering optical media such as dielectric phosphor powder (DPP). The DPP is made of a mixture of nearly spherical dielectric particles of amorphous $SiO_2$ with radii generally between 50 and 5000 nm, and micro-crystals of garnet fluorescent material with radii generally between 1000 and 10,000 nm. The LED according to this particular embodiment can also be a white LED.

According to a yet additional embodiment, the invention provides an LED comprising a light emitting component such as an AlInGaN semiconductor chip encapsulated into scattering optical media such as dielectric phosphor powder (DPP). The DPP is made of a mixture of nearly spherical dielectric particles of amorphous GaN with radii generally between 50 and 5000 nm, and micro-crystals of garnet fluorescent material with radii generally between 1000 and 10,000 nm. The LED according to this particular embodiment can also be a white LED.

An exemplary structure of an LED according to a preferred embodiment of the invention comprises a crystalline semiconductor chip encapsulated into epoxy, wires connected to the semiconductor chip, metallic leads connected to the wires, and an epoxy encapsulation covered with scattering optical media such as dielectric phosphor powder (DPP). The DPP is made of a mixture of nearly spherical dielectric particles with crystalline phosphor particles embedded into the epoxy.

BRIEF DESCRIPTION OF THE DRAWINGS

The foregoing and other advantages and features of the invention will become more apparent from the detailed description of the preferred embodiments of the invention given below with reference to the accompanying drawings in which:

FIG. 1a is a diagram illustrating an LED with light wavelength conversion in the art;

FIG. 1b is a diagram illustrating, in conjunction with FIG. 1a, an LED with light wavelength conversion in the art using dense phosphor powder;

FIG. 1c is a diagram illustrating, in conjunction with FIG. 1a, an LED with light wavelength conversion in the art using dilute phosphor powder;

FIG. 1d is a diagram illustrating light wavelength conversion using scattering optical media such as dielectric phosphor powder (DPP) in accordance with the invention;

DETAILED DESCRIPTION OF THE PREFERRED EMBODIMENTS

Figure 2A:
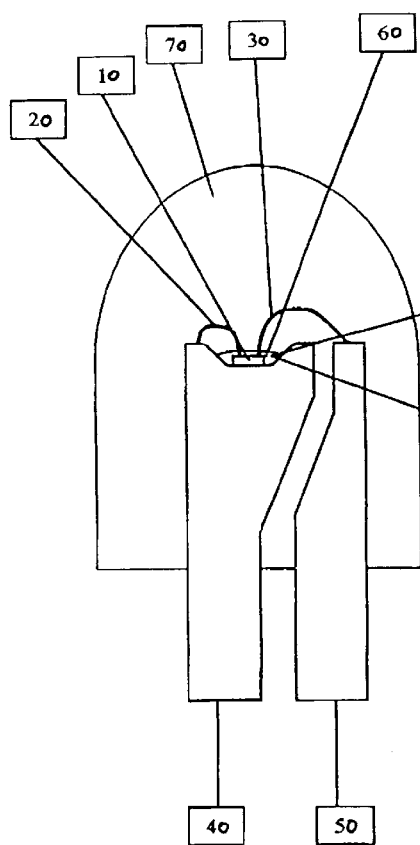
FIGS. 2a and 2b are diagrams that illustrate another embodiment of an LED with light wavelength conversion using the scattering optical media such as dielectric phosphor powder (DPP) in accordance with the invention.

FIG. 1d is a diagram that illustrates light wavelength conversion using scattering optical media such as dielectric phosphor powder (DPP) in accordance with the invention, as applied to the LED shown in FIG. 1a. The wavelength converting substance 6 of FIG. 1a is replaced with a dielectric phosphor powder or DPP. The DPP according to the invention is made of a mixture of microscopic, nearly spherical dielectric particles and crystalline phosphor particles embedded in the epoxy 9d. The employment of light scattering media or dispersion media such as dielectric particles (or any particles with a band gap larger than 3 eV) in an LED significantly improves the light uniformity of a light emitted by the LED. The weight or volume concentration of the crystalline phosphor particles embedded in the epoxy 9d depends on the thickness of the epoxy layers and the size and distribution of the phosphor particles. The concentration of the phosphor particles are generally 2% to 25% of the total volume of the dielectric phosphor powder (DPP). Phosphor particles that can be used according to the invention include Gd, Y, Ce or Nd-based phosphors.

The dielectric phosphor powder (DPP) is made of a mixture of microscopic, nearly spherical dielectric particles and phosphor particles. The spherical dielectric microparticles can be made of wide-band-gap semiconductors or transparent dielectrics. The DPP forms scattering optical media, whose refractive index, scattering properties and light conversion properties are controlled by the refractive index and radii of the dielectric particles. Using DPP in the LED allows effective light extraction from the light emitting component of the LED (e.g., the crystalline semiconductor chip), effective light wavelength conversion, and substantially uniform color distribution over emission angles, and wider emission angle of the light generated by the LED with DPP, in contrast to conventional LEDs with light conversion without DPP.

The scattering optical media such as DPP can also include phosphor particles, and bubbles (or voids) instead of the dielectric particles. The bubbles of the DPP have a band gap larger than 3 eV. The bubbles are spherical in nature because of surface tension thereof, which function as light scattering media for light wavelength conversion in accordance with the invention. The bubbles can be air bubbles, N2 bubbles, noble gas bubbles. The bubble are disposed onto the epoxy 9$d$ by introducing gas corresponding to the bubbles during molding of the epoxy 9$d$. Furthermore, the DPP can also be a mixture of the bubbles, dielectric particles, and the phosphor particles.

The structure of the LED according to this particular embodiment of the invention includes a crystalline semiconductor chip, scattering optical media such as dielectric phosphor powder (DPP) made of a mixture of microscopic, nearly spherical dielectric particles with crystalline phosphor particles embedded into the epoxy 9$d$, wires connected to the semiconductor chip, metallic leads connected to the wires for transferring an electrical current to the semiconductor chip, and an epoxy encapsulation covered with the dielectric phosphor powder or DPP.

In another embodiment according to the invention, the scattering optical media such as DPP is made of a mixture of microscopic, nearly spherical dielectric particles of microcrystalline AlN. According to yet another embodiment, the DPP is made of a mixture of nearly spherical dielectric particles of amorphous $Si_3N_4$ with radii generally between 50 and 5000 nm, and micro-crystals of garnet fluorescent material with radii generally between 1000 and 10,000 nm. In an additional embodiment, the DPP is made of a mixture of nearly spherical dielectric particles 10$d$ of amorphous $SiO_2$ with radii generally between 50 and 5000 nm, and micro-crystals of garnet fluorescent material 8$d$ with radii generally between 1000 and 10,000 nm embedded into the epoxy 9$d$. According to a further embodiment, the DPP is made of a mixture of nearly spherical dielectric particles 10$d$ of amorphous GaN with radii generally between 50 and 5000 nm, and micro-crystals of garnet fluorescent material 8$d$ with radii generally between 1000 and 10,000 nm embedded into the epoxy 9$d$.

Figure 2B:
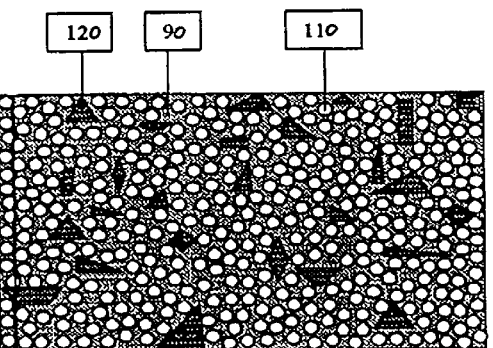

FIGS. 2$a$ and 2$b$ are diagrams illustrating another embodiment of an LED with light wavelength conversion using scattering optical media such as dielectric phosphor powder (DPP) according to the invention. The invention provides an LED comprising a light emitting component and scattering optical media such as dielectric phosphor powder (DPP) which absorb a part of light emitted by the light emitting component and emits light of a wavelength that is different from that of the absorbed light. In a preferred embodiment according to the invention, the LED includes a crystalline semiconductor chip (InGaN crystalline semiconductor chip 10) serving as the light emitting component. The DPP is made of a mixture of nearly spherical dielectric particles with crystalline phosphor particles embedded into the epoxy 70. The weight or volume concentration of the crystalline phosphor particles embedded in the epoxy encapsulation 90 depends on the thickness of the epoxy layers and the size and distribution of the phosphor particles. The concentration of the phosphor particles can be 2% to 25% by volume. Phosphor particles that can be used according to the invention include Gd, Y, Ce or Nd-based phosphors. In particular, the DPP wavelength converting substance 60 is made of the mixture of nearly spherical dielectric particles 110 of amorphous $Si_3N_4$ with radii generally between 50 and 1000 nm and micro-crystals 120 of garnet fluorescent material with radii generally between 1000 and 10000 nm embedded into the epoxy 90. Semiconductor chip 10, serving as the light emitting component in the LED, generates primary light when an electrical current is applied to the chip 10 through wires 20 and 30, which are electrically connected to metallic leads 40 and 50. The wavelength converting substance 60, containing DPP, covers the light emitting component (i.e., semiconductor chip 10) and is molded in resin. An n electrode and p electrode of the semiconductor chip 10 are electrically connected to the metallic leads 40 and 50, respectively, by means of the wires 20 and 30.

The scattering optical media such as DPP can also include phosphor particles, and bubbles (or voids) instead of the dielectric particles. The bubbles of the DPP have a band gap larger than 3 eV. The bubbles are spherical in nature because of surface tension thereof, which function as light scattering media for light wavelength conversion in accordance with the invention. The bubbles can be air bubbles, N2 bubbles, noble gas bubbles. The bubble are disposed onto the epoxy 90 by introducing gas corresponding to the bubbles during molding of the epoxy 90. Furthermore, the DPP can also be a mixture of the bubbles, dielectric particles, and the phosphor particles.

The structure of the LED according to this particular embodiment of the invention includes a crystalline semiconductor chip 10 encapsulated into scattering optical media such as dielectric phosphor powder (DPP) made of a mixture of microscopic, nearly spherical dielectric particles with crystalline phosphor particles embedded into the epoxy 90, the wires 20 and 30 connected to the semiconductor chip 10, the metallic leads 40 and 50 connected to the wires for transferring an electrical current to the semiconductor chip, and an epoxy encapsulation 90 covered with the scattering optical media such as DPP.

The light emitting component used in the LED is a gallium nitride compound semiconductor capable of efficiently exciting the garnet fluorescent material in the DPP. The light emitting component of the LED is made by forming a light emitting layer of InGaN on a substrate in a semiconductor process. The structure of the light emitting component can be a homostructure, heterostructure or double heterostructure.

In this particular embodiment according to the invention, as an electrical current is applied to the crystalline semiconductor chip 10, it generates a primary blue-green light with wavelength $\lambda_p$ in region from 400 to 500 nm. The DPP wavelength converting substance 60 absorbs the primary blue-green light and generates the secondary yellow-orange light with wavelength $\lambda_s$ in region from 550 to 660 nm. The resulting light coming out of the LED with the DPP is the sum of the blue-green light with wavelength $\lambda_p$ and the yellow-orange light with wavelength $\lambda_s$, which appears white to human eyes.

The color quality of the resulting white light is determined by the distribution over the emission angle of the ratio of the intensities of the primary blue-green light and the secondary yellow-orange light, and is controlled by the DPP wavelength converting substance 60. The DPP wavelength converting substance 60 is made of the mixture of near spherical dielectric particles 110 of amorphous $Si_3N_4$ with radii $R_s$ in the region $R_s$=50 to 1000 nm and micro-crystals 120 of garnet fluorescent material with radii in the region $R_m$=1000 to 10000 nm embedded into the epoxy 90. The light scattering properties of the spherical dielectric particles of amorphous $Si_34_4$ strongly depend on their radii $R_s$, where $R_s=\lambda_p/2\lambda.n_e$, and ne=1.3 to 1.5 which is the refractive index of the epoxy encapsulation 70. This allows the control of the angle distribution of the ratio in the intensities of the primary blue-green light and the secondary yellow-orange light, and the quality of the white light emitted by the LED by controlling the radii $R_s$ of the nearly spherical dielectric particles of amorphous $Si_3A_4$.

Since the refractive index of $Si_3A_4$ spherical particles $n_s=2.05$ is close to square root of the product of the refractive index of InGaN crystalline semiconductor chip 10 (where $n_c=2.3$ to 2.8) and refractive index epoxy encapsulation 70 (where $n_e=1.3$ to 1.5), using the DPP in the LED in accordance with the invention significantly improves the primary light extraction from the semiconductor chip 10.

According to another embodiment, the invention provides a light emitting diode (LED) comprising a light emitting component (such as an AlInGaN crystalline semiconductor chip 10) encapsulated into scattering optical media such as dielectric phosphor powder (DPP). The scattering optical media such as DPP wavelength converting substance 60 is made of a mixture of microscopic, nearly spherical dielectric particles of microcrystalline AlN embedded into the epoxy 90. According to yet another embodiment, the invention provides an LED comprising a light emitting component such as an AlInGaN semiconductor chip 10 encapsulated into dielectric phosphor powder (DPP). The DPP wavelength converting substance 60 is made of a mixture of nearly spherical dielectric particles of amorphous GaN with radii generally between 50 and 5000 nm, and micro-crystals of garnet fluorescent material with radii generally between 1000 and 10,000 nm embedded into the epoxy 90.

Figure 3A:
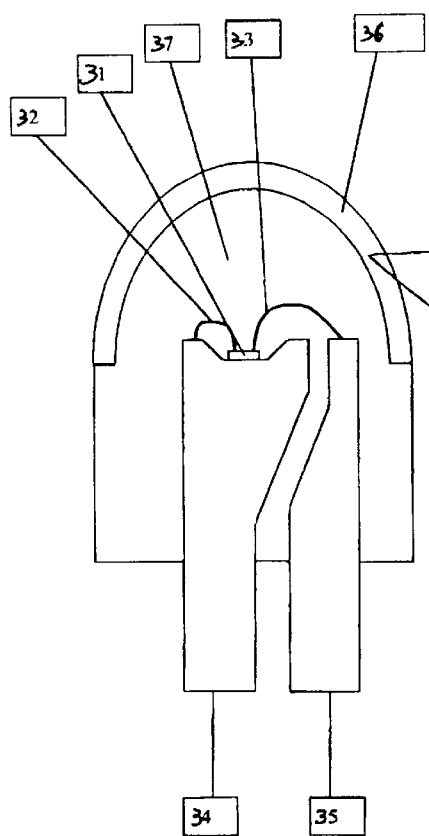
FIGS. 3a and 3b are diagrams that illustrate yet another embodiment of an LED or other light emitting means such as a laser diode (LD) with light wavelength conversion using the scattering optical media such as dielectric phosphor powder (DPP) in accordance with the invention.
Figure 3B:
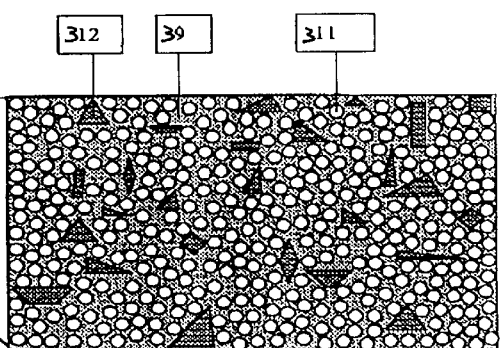

FIGS. 3a and 3b are diagrams that illustrate a further embodiment of an LED or other light emitting means such as a laser diode (LD) with light wavelength conversion using scattering optical media according to the invention. The invention provides an LED (or a light emitting means such as an LD) comprising a light emitting component such as a transparent encapsulant and scattering optical media such as voids or dielectric phosphor powder (DPP) which absorb a part of light emitted by the light emitting component and emits light of a wavelength that is different from that of the absorbed light. The scattering optical media are directly added to a transparent encapsulant 37 of the LED which is selected from the group consisting of a dome-shaped lens, epoxy, lenticular lens, sheet glass, sheet plastics of polymethyl methacrylate (PMMA), and sheet plastics of polycarbonate.

In another preferred embodiment according to the invention, the LED includes a crystalline semiconductor chip (InGaN crystalline semiconductor chip 31) serving as the light emitting component. The DPP is made of a mixture of nearly spherical dielectric particles with crystalline phosphor particles embedded into the transparent encapsulant 37. The weight or volume concentration of the crystalline phosphor particles embedded in the epoxy 39 depends on the thickness of the epoxy layers and the size and distribution of the phosphor particles. The concentration of the phosphor particles can be 2% to 25% by volume. Phosphor particles that can be used according to the invention include Gd, Y, Ce or Nd-based phosphors. In particular, the DPP wavelength converting substance 36 is made of the mixture of nearly spherical dielectric particles 311 of amorphous $SiO_2$ with radii generally between 50 and 1000 nm and micro-crystals 312 of garnet fluorescent material with radii generally between 1000 and 10000 nm embedded into the epoxy 39. Semiconductor chip 31, serving as the light emitting component in the LED, generates primary light when an electrical current is applied to the chip 31 through wires 32 and 33, which are electrically connected to metallic leads 34 and 35. The wavelength converting substance 36, containing DPP, covers the light emitting component (i.e., semiconductor chip 31) and is molded in resin. An n electrode and p electrode of the semiconductor chip 31 are electrically connected to the metallic leads 34 and 35, respectively, by means of the wires 32 and 33.

The scattering optical media such as DPP can also include phosphor particles, and bubbles (or voids) instead of the dielectric particles. The bubbles of the DPP have a band gap larger than 3 eV. The bubbles are spherical in nature because of surface tension thereof, which function as light scattering media for light wavelength conversion in accordance with the invention. The bubbles can be air bubbles, N2 bubbles, noble gas bubbles. The bubble are disposed onto the epoxy 39 by introducing gas corresponding to the bubbles during molding of the epoxy 39. Furthermore, the DPP can also be a mixture of the bubbles, dielectric particles, and the phosphor particles.

The structure of the LED according to this particular embodiment of the invention includes a crystalline semiconductor chip 31 encapsulated into the transparent encapsulant 37, the wires 32 and 33 connected to the semiconductor chip, the metallic leads 34 and 35 connected to the wires for transferring an electrical current to the semiconductor chip 31, and an epoxy encapsulation 39 covered with the scattering optical media such as dielectric phosphor powder (DPP) made of a mixture of microscopic, nearly spherical dielectric particles with crystalline phosphor particles embedded into the transparent encapsulant 37. The scattering optical media are directly added to the transparent encapsulant 37 which is selected from the group consisting of a dome-shaped lens, epoxy, lenticular lens, sheet glass, sheet plastics of polymethyl methacrylate (PMMA), and sheet plastics of polycarbonate. In the present embodiment, the transparent encapsulant 37 as shown in FIG. 3a is a dome-shaped lens.

In this particular embodiment according to the invention, as an electrical current is applied to the crystalline semiconductor chip 31, it generates a primary blue-green light with wavelength $\lambda_p$ in region from 400 to 500 nm. The DPP wavelength converting substance 36 absorbs the primary blue-green light and generates the secondary yellow-orange light with wavelength $\lambda_s$ in region from 550 to 660 nm. The resulting light coming out of the LED with the DPP is the sum of the blue-green light with wavelength $\lambda_p$ and the yellow-orange light with wavelength $\lambda_s$, which appears white to human eyes.

The color quality of the resulting white light is determined by the distribution over the emission angle of the ratio of the intensities of the primary blue-green light and the secondary yellow-orange light, and is controlled by the DPP wavelength converting substance 36. The DPP wavelength converting substance 36 is made of the mixture of near spherical dielectric particles 311 of amorphous $SiO_2$ with radii $R_s$ in the region $R_s=50$ to 1000 nm and micro-crystals 312 of garnet fluorescent material with radii in the region $R_m=1000$ to 10000 nm embedded into the epoxy 39. The light scattering properties of the spherical dielectric particles of amorphous $SiO_2$ strongly depend on their radii $R_s$, where $R_s=\lambda_p/2\lambda_e$, and $n_e=1.3$ to 1.5 which is the refractive index of the transparent encapsulant 37. This allows the control of the angle distribution of the ratio in the intensities of the primary blue-green light and the secondary yellow-orange light, and the quality of the white light emitted by the LED by controlling the radii $R_s$ of the nearly spherical dielectric particles of amorphous $SiO_2$.

Other materials that can be used for the garnet fluorescent material (e.g., 120 of FIG. 2b and 312 of FIG. 3b) include phosphor of garnet fluorescent material activated with cerium which contains at least one element selected from Y, Lu, Sc, La, Gd and Sm, and at least one element selected from Al, Ga and In. For example, materials such as yttrium-aluminum-garnet fluorescent material (YAG phosphor) activated with cerium can be used in the DPP according to the invention.

Other materials that can be used for the garnet fluorescent material further include phosphors selected from the group consisting of Ag:ZnS (blue), CuAuAl:ZnS (green), CuAl:ZnS (green), Mg4(F)GeO5:Mn (red) or Ce:YAG (yellow green). Other materials useful for the garnet flourescent material further include phosphors selected from the group consisting of Coumarin 6 (very nice green, very efficient), Fluorol 7GA (yellow green, very efficient), DOCI (green, short attenuation length), Rhodamine 110 (yellow, very efficient), DCM (orange, moderately efficient), Pyridine 1 (red, poor efficiency) or Pyridine 2 (deep red, poor efficiency).

Although the discussions herein are in the context of an LED, it is understood that other light sources (e.g., a planar light source, laser diodes) will benefit from the methodology according to the invention. Moreover, although some of the discussions herein are in the context of a white LED, it is also understood that other light wavelength emitters will benefit from the methodology according to the invention. The fields of application for an LED with scattering optical media such as DPP according to the invention include at least electronics, instrumentation, electrical appliances, displays for automobiles, aircraft, as well as outdoor displays, or any other illumination applications.

Although the invention has been particularly shown and described in detail with reference to the preferred embodiments thereof, the embodiments are not intended to be exhaustive or to limit the invention to the precise forms disclosed herein. It will be understood by those skilled in the art that many modifications in form and detail may be made without departing from the spirit and scope of the invention. Similarly, any process steps described herein may be interchangeable with other steps to achieve substantially the same result. All such modifications are intended to be encompassed within the scope of the invention, which is defined by the following claims and their equivalents.

We claim:

1. A light emitting diode (LED) comprising:
a light emitting component emitting a light including a transparent encapsulant; and scattering optical media added to the transparent encapsulant;
wherein the scattering optical media is a mixture of phosphor particles and voids.

2. The LED of claim 1 wherein the scattering optical media are selected from the group consisting of air bubbles, N2 bubbles, and noble gas bubbles.

3. The LED of claim 1 wherein the scattering optical media have a band gap larger than 3 eV.

4. The LED of claim 1 wherein the scattering optical media do not absorb blue light.

5. The LED of claim 1 further comprising:
a crystalline semiconductor chip wherein the scattering optical media are embedded into the epoxy;
wires connected to the semiconductor chip; and
metallic leads connected to the wires for transferring an electrical current to the semiconductor chip.

6. The LED of claim 1 further comprising:
a crystalline semiconductor chip encapsulated into the scattering optical media;
wires connected to the semiconductor chip; and
metallic leads connected to the wires for transferring an electrical current to the semiconductor chip;
wherein the semiconductor chip is one selected from the group consisting of a nitride compound semiconductor chip, a gallium nitride compound semiconductor, InGaN crystalline semiconductor chip, and AlInGaN crystalline semiconductor chip.

7. The LED of claim 1 wherein the transparent encapsulant further comprises a garnet fluorescent material selected from the group consisting of Gd, Y, Ce and Nd-based phosphors.

8. The LED of claim 1 wherein the transparent encapsulant further comprises a garnet fluorescent material selected from the group consisting of Ag:ZnS, CuAuAl:ZnS, CuAl:ZnS, Mg4(F)GeO5:Mn and Ce:YAG.

9. The LED of claim 1 wherein the transparent encapsulant further comprises a garnet fluorescent material selected from the group consisting of Coumarin 6, Fluorol 7GA, DOCI, Rhodamine 110, DCM, Pyridine 1 and Pyridine 2.

10. The LED of claim 1 wherein the scattering optical media further comprise a dielectric phosphor powder made of a mixture of crystalline phosphor particles and dielectric particles.

11. The LED of claim 10 wherein concentration of the phosphor particles is generally 2% to 25% of total volume of the dielectric phosphor powder (DPP).

12. The LED of claim 10 wherein the dielectric particles are selected from the group consisting of microcrystalline AlN, amorphous $Si_3N_4$, amorphous GaN, and amorphous $SiO_2$.

13. The LED of claim 10 wherein the dielectric particles are selected from the group consisting of amorphous $Si_3N_4$ with radii generally between 50 and 5000 nm, amorphous $SiO_2$ with radii generally between 50 and 5000 nm, and amorphous GaN with radii generally between 50 and 5000 nm.

14. The LED of claim 10 wherein the phosphor particles are micro-crystals of a garnet fluorescent material with radii generally between 1000 and 10,000 nm.

15. The LED of claim 10 wherein the phosphor particles are selected from the group consisting of Gd, Y, Ce and Nd-based phosphors.

16. The LED of claim 10 wherein the phosphor particles include phosphors of garnet fluorescent material activated with cerium containing at least one element selected from the group consisting of Y, Lu, Sc, La, Gd and Sm, and at least one element selected from another group consisting of Al, Ga and In.

17. The LED of claim 1 wherein the transparent encapsulant is selected from the group consisting of a dome-shaped lens, epoxy, lenticular lens, sheet glass, sheet plastics of polymethyl methacrylate (PMMA), and sheet plastics of polycarbonate.

18. The LED of claim 1 wherein the scattering optical media absorb a part of the light emitted by the light emitting component and emit light of a wavelength that is different from that of the absorbed light.

19. A laser diode (LD) comprising: a light emitting component emitting a light including a transparent encapsulant; and scattering optical media added to the transparent encapsulant;
wherein the scattering optical media is a mixture of phosphor particles and voids.

20. The LD of claim 19 wherein the scattering optical media are selected from the group consisting of air bubbles, N2 bubbles, and noble gas bubbles.

21. The LD of claim 19 wherein the scattering optical media have a band gap larger than 3 eV.

22. The LD of claim 19 wherein the scattering optical media do not absorb blue light.

23. The LD of claim 19 wherein the transparent encapsulant further comprises a garnet fluorescent material selected from the group consisting of Gd, Y, Ce and Nd-based phosphors.

24. The LD of claim 19 wherein the transparent encapsulant further comprises a garnet fluorescent material selected from the group consisting of Ag:ZnS, CuAuAl:ZnS, CuAl:ZnS, Mg4(F)GeO5:Mn and Ce:YAG.

25. The LD of claim 19 wherein the transparent encapsulant further comprises a garnet fluorescent material selected from the group consisting of Coumarin 6, Fluorol 7GA, DOCI, Rhodamine 110, DCM, Pyridine 1 and Pyridine 2.

26. The LD of claim 19 wherein the scattering optical media further comprise a dielectric phosphor powder made of a mixture of crystalline phosphor particles and dielectric particles.

27. The LD of claim 26 wherein concentration of the phosphor particles is generally 2% to 25% of total volume of the dielectric phosphor powder (DPP).

28. The LD of claim 26 wherein the dielectric particles are selected from the group consisting of microcrystalline AlN, amorphous $Si_3N_4$, amorphous GaN, and amorphous $SiO_2$.

29. The LD of claim 26 wherein the dielectric particles are selected from the group consisting of amorphous $Si_3N_4$ with radii generally between 50 and 5000 nm, amorphous $SiO_2$ with radii generally between 50 and 5000 nm, and amorphous GaN with radii generally between 50 and 5000 nm.

30. The LD of claim 26 wherein the phosphor particles are micro-crystals of a garnet fluorescent material with radii generally between 1000 and 10,000 nm.

31. The LD of claim 26 wherein the phosphor particles are selected from the group consisting of Gd, Y, Ce and Nd-based phosphors.

32. The LD of claim 26 wherein the phosphor particles include phosphors of garnet fluorescent material activated with cerium containing at least one element selected from the group consisting of Y, Lu, Sc, La, Gd and Sm, and at least one element selected from another group consisting of Al, Ga and In.

33. The LD of claim 19 wherein the transparent encapsulant is selected from the group consisting of a dome-shaped lens, epoxy, lenticular lens, sheet glass, sheet plastics of polymethyl methacrylate (PMMA), and sheet plastics of polycarbonate.

34. The LD of claim 19 wherein the scattering optical media absorb a part of the light emitted by the light emitting component and emit light of a wavelength that is different from that of the absorbed light.

* * * * *